United States Patent [19]

Peters

[11] Patent Number: 4,994,764
[45] Date of Patent: Feb. 19, 1991

[54] SINGLE-PIN OSCILLATOR

[75] Inventor: Matthias Peters, Halstenbek, Fed. Rep. of Germany

[73] Assignee: U. S. Philips Corporation, New York, N.Y.

[21] Appl. No.: 439,905

[22] Filed: Nov. 20, 1989

[30] Foreign Application Priority Data

Nov. 24, 1988 [DE] Fed. Rep. of Germany ....... 3839658

[51] Int. Cl.$^5$ .......................... H03B 5/12; H03B 5/36
[52] U.S. Cl. ............................. 331/116 R; 331/108 C; 331/117 R; 331/158; 331/177 R
[58] Field of Search ............. 331/36 C, 108 C, 116 R, 331/116 FE, 117 R, 117 FE, 158, 177 R, 177 V

[56] References Cited

U.S. PATENT DOCUMENTS 4,518,933 5/1985 Kroner ........................... 331/108 D
4,574,257 3/1986 Kasperkovitz et al. ........ 331/116 R Primary Examiner—David Mis
Attorney, Agent, or Firm—Bernard Franzblau

[57] ABSTRACT

A single pin oscillator which consists of first and second transistors (17, 18) whose collectors are connected, via respective collector resistances (19, 20), to the positive pole of a DC source $U_V$ and whose emitters are connected to the negative pole thereof via respective emitter resistances (21, 22). The collector of each transistor is connected to the base of the other transistor. A quartz crystal (12) or a series resonant circuit is connected to the emitter of one transistor (17) and parallel to the corresponding emitter resistance (21). A driver circuit (231) is provided for an oscillator voltage which can be coupled out to an external low-ohmic, highly capacitive load connected to the emitter of the other transistor (18) and parallel to the corresponding emitter resistance (22).

12 Claims, 1 Drawing Sheet

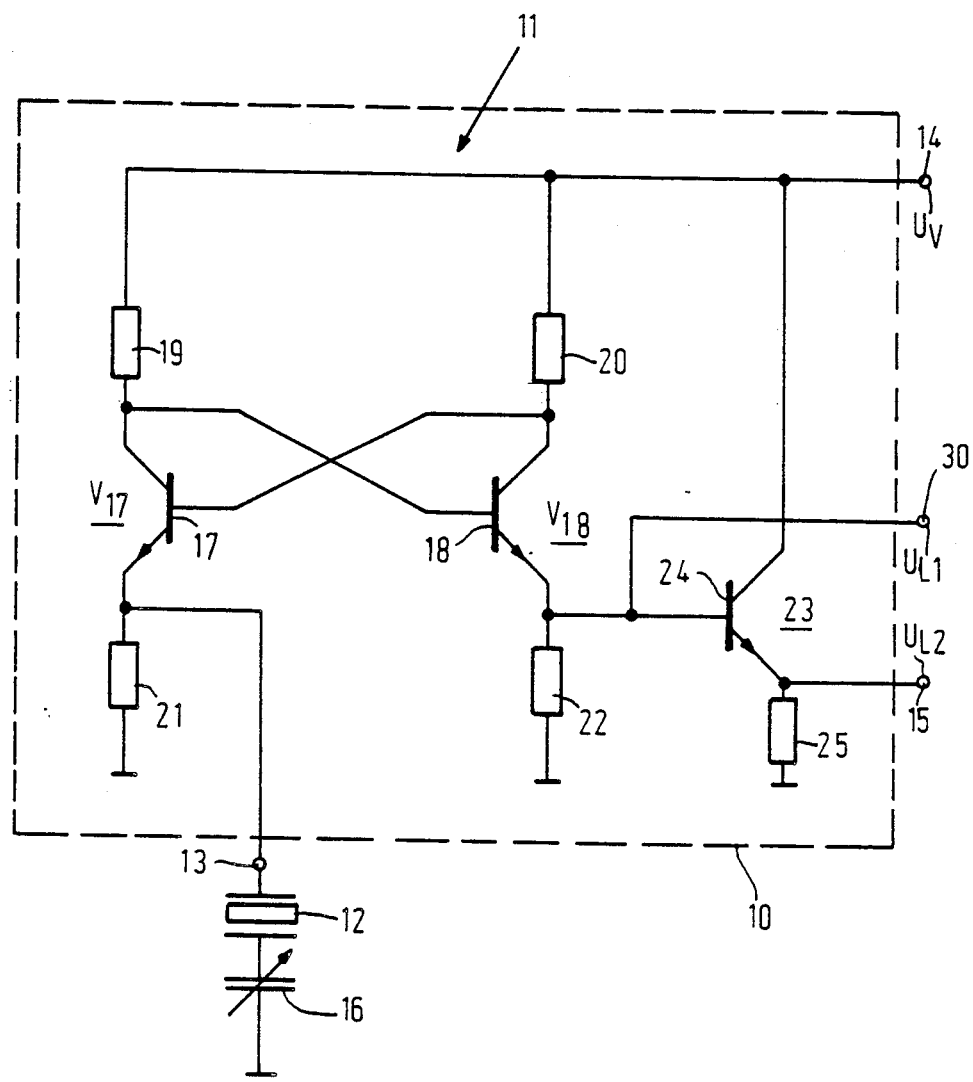

SINGLE-PIN OSCILLATOR

BACKGROUND OF THE INVENTION

The present invention relates to an oscillator and more particularly to an oscillator of the type that includes two directly cross-coupled inverters each of which comprises a transistor connected between a first and second resistor and with a frequency-determining element connected in parallel with one of the resistors in one of the inverters.

From DE-OS No. 31 04 849, which corresponds to U.S. Pat. No. 4,518,933 (5/21/85), a quartz oscillator is known which comprises one connection pin for a quartz crystal, two transistor pairs, and a transistor which is connected as an emitter follower and which serves for connection to a power supply voltage. The emitter-connected transistor is preceded by a bias voltage generator with a diode series connection or the like. The collectors of one transistor pair are connected, via a respective collector impedance, to the emitter of the transistor which serves for the supply of power and also to a respective base of a transistor of the other transistor pair whose collectors are also connected to the emitter of the aforesaid power supply transistor. The oscillator voltage can be coupled out between the emitters of this transistor pair. These emitters are also connected to a respective base of a transistor of the former transistor pair, each of the emitters of which has an emitter impedance connected to the negative pole of the power supply voltage. A capacitor is connected parallel to one emitter impedance and a series connection of a quartz crystal and a capacitor is connected parallel to the other emitter impedance. Even tough the integrated circuit version of this oscillator requires only one connection pin for the quartz crystal, the circuit, inter alia, is very intricate and not suitable for driving an external load without using an additional output driver stage. It also requires a large chip surface area because of the large number of components and exhibits, as tests have shown, comparatively large frequency variations in dependence on the power supply voltage.

SUMMARY OF THE INVENTION

It is an object of the present invention to provide an oscillator which comprises only one connection pin for a quartz crystal or other frequency determining element and which includes a circuit which has a simple construction, requires relatively little chip surface area, and has a substantially impedance-independent output for an external load, and its frequency variation as a function of a variation of the power supply voltage being small.

This object is achieved because the oscillator signal is coupled out at a non-inverting output of the inverter other than the inverter to which the frequency-determining element is connected.

In accordance with an advantageous embodiment of the invention, a driver circuit is provided having an input coupled with said non-inverting output for coupling out a further oscillator signal. The frequency determining element preferably includes a quartz crystal or a LC-resonant circuit. Preferably, the quotient of the resistance connected to the inverting output and the resistance connected to the non-inverting output is smaller than one.

The oscillator in accordance with the invention enables operation with an unilaterally grounded quartz crystal. The circuit of the oscillator, having directly cross-coupled inverters, essentially comprises two transistors, each of which comprises a collector resistance and an emitter resistance, thus forming a respective amplifier with a phase shift. The relevant gain factor results approximately from the ratio of the collector resistance to the emitter resistance. In accordance with the invention, the relevant resistances must be chosen so that the quotient of the collector resistance and the emitter resistance is always smaller than 1.

The base of each transistor forms the input of the relevant amplifier and the collector forms the output of the amplifier. When the amplifiers or the transistors are numbered from left to right in a circuit, the output, that is to say the collector of the second transistor, is fed back to the input, that is to say the base of the first transistor. Conversely, the output of the first amplifier, that is to say the collector of the first transistor, is fed back to the input of the second amplifier, that is to say the base of the second transistor. The quartz crystal is connected parallel to the first emitter resistance. In accordance with a generally known equivalent diagram, it has a series loss resistance. This resistance is included in a path parallel to said emitter resistance. When the collector and emitter resistances of both transistors are suitably chosen, it has been found that oscillation will be possible without both amplifiers exhibiting the same gain.

This is essentially due to the fact that the condition, that the overall gain must be larger than 1 in order to satisfy the oscillation condition, is satisfied by the product of a quotient of the collector resistance of the first transistor and the series loss resistance of the quartz crystal and a quotient of the collector resistance and the emitter resistance of the second transistor.

In order to provide a variation of the quartz oscillator frequency within a small range, for example, for exact adjustment to a desired frequency value, a capacitor of variable capacitance which is high with respect to that of the quartz crystal may be connected in series with the quartz crystal.

This circuit of a quartz oscillator in accordance with the invention, comprising few components, is already suitable for coupling out an oscillator voltage for a low-ohmic external load. This is essentially due to the fact that the second transistor is connected as a quasi emitter follower, so that an oscillator voltage for a low-ohmic load can be coupled out via its emitter resistance.

When, moreover, the external load is highly capacitive, i.e. has a low impedance from an AC point of view, a driver circuit comprising a further transistor is provided in accordance with the invention. The base of this further transistor is connected to the emitter of the second transistor. Its collector is connected to the operating voltage. An oscillator voltage for an external low-ohmic and highly capacitive load can be coupled out at the emitter of the further transistor to which an emitter resistance is connected. The resistance of this emitter resistance is suitably proportioned to adjust the working point for the transistor so that the dynamic emitter output resistance is sufficiently low-ohmic, that is to say usually not higher than the resistance of the load, in order to be capable of driving the load.

This further possibility for coupling out the oscillator voltage can be attractively used, for example, for driving two loads simultaneously, it even being permissible for said loads to be different.

The quartz oscillator circuit in accordance with the invention comprises few components and is suitable for a power supply of from a few Volts to more than 10 Volts. According to the present state of the art, substantially higher power supply voltages are often required. For example, for the technically more elaborate quartz oscillator known from the cited DE-OS No. 31 04 849 (U.S. Pat. No. 4,518,933) a power supply voltage of more than 10 Volts is required. This more elaborate quartz oscillator, moreover, is suitable only for signal processing within an integrated circuit. Consequently, when an external load is to be served, an additional output driver stage will in any case be required.

It is to be noted that the oscillator is suitable not only for connection of a quartz crystal, but that instead of a quartz crystal a ceramic resonant circuit, or an LC series resonant circuit or the like may be provided.

It has also been found that in the quartz oscillator in accordance with the invention the dependency of the frequency variation on the power supply voltage is very slight. For example, for 13 MHz the variation amounts to only approximately 1 kHz per Volt.

Further preferred embodiments of the oscillator in accordance with the invention are described below and are claimed in the dependent claims.

BRIEF DESCRIPTION OF THE DRAWING

An embodiment in accordance with the invention now will be described in detail hereinafter with reference to the accompanying sole drawing.

DETAILED DESCRIPTION OF THE INVENTION

The drawing shows a block 10 which symbolizes that the oscillator circuit 11, which is situated within the block 10, can be constructed as an integrated circuit. For the connection of a quartz crystal 12 only one additional external connection 13 will be required. The further connections 14, 15 and 30 fed out from the block 10 serve on the one hand for the power supply voltage $U_V$ for the oscillator circuit 11 and on the other hand for coupling out the oscillator voltages $U_{L1}$, $U_{L2}$ for the connection of external loads, so also an external, for example low-ohmic and highly capacitive load, i.e. a load with a low-ohmic impedance from an AC point of view. The drawing does not show such a load.

Outside the block 10 and in series with the quartz crystal 12 there may be provided a grounded capacitor 16 of variable capacitance. This capacitor 16 serves to vary the frequency of the oscillator in a very small range in order to enable exact adjustment to a desired frequency value. The capacitance of this capacitor 16 must be high with respect to the capacitance of the quartz crystal.

The oscillator circuit 11 comprises first and second inverters made up of first and second transistors 17 and 18 with respective collector resistances 19 and 20 and emitter resistances 21 and 22. The collector resistances 19 and 20 are the same and are connected to the terminal 14 and hence to the positive pole of the power supply voltage $U_V$. The emitter resistances 21 and 22 are also the same and are connected to ground. The resistances must be proportioned so that the quotient of the collector resistance and the emitter resistance is smaller than 1. In an exemplary embodiment, to which all subsequent numerical dimension values also refer, this quotient amount to 0.5. The transistors 17 and 18 form, in conjunction with the corresponding collector and emitter resistances, a respective amplifier with a 180° phase shift. The relevant gain factor is generally determined by the quotient of the collector resistance and the emitter resistance. It is to be noted that the quartz oscillator in accordance with the invention is constructed using npn transistors. When pnp transistors are used, the polarity of all voltages and currents is reversed. It will be clear that in other technologies unipolar transistors may be used as well.

The transistor 17 forms an amplifier stage $V_{17}$ and the transistor 18 forms an amplifier stage $V_{18}$. The output of the amplifier stage $V_{18}$ is fed back to the input of the amplifier stage $V_{17}$. Conversely, the output of the amplifier stage $V_{17}$ is fed back to the input of the amplifier stage $V_{18}$. The output of the amplifier stage $V_{17}$ is formed by the collector of the transistor 17 and the input is formed by the base of the transistor 17. The output of the amplifier stage $V_{18}$ corresponds to the collector of the transistor 18 and the input corresponds to its base. The overall gain then amounts to $V = V_{17} V_{18}$, i.e. The product of the two gains. The condition for oscillation is: $k\,V \geq 1$, where $k = 1$ in this case and $V = (-0.5)(-0.5) = 0.25$ (without quartz crystal). Consequently, without the quartz crystal or an LC circuit oscillation is not possible. Oscillation becomes possible only after the additional connection of the terminal 13 to the emitter of the transistor 17, i.e. after connection of the quartz crystal. This is because in the case of series resonance of the quartz crystal only the series loss resistance (not shown) is effective. It is connected parallel to the emitter resistance 21. For the dimensions given by way of example, the emitter resistances 21 and 22 have a value of 6 kOhms and the collector resistances 19, 20 have a value of 3 kOhms. Therefore, the emitter resistance 21 is usually much higher than the series loss resistance of only approximately 100 Ohms. As a result, the parallel arrangement of the emitter resistance 21 and the series loss resistance can be replaced approximately by the series loss resistance in the case of series resonance. The overall gain $\underline{v}$ in the case of series resonance is to be derived approximately from the product of the quotient of the collector resistance 19 and the series loss resistance and the collector resistance 20 and the emitter resistance 22. The negative signs of the collector resistances in this equation are eliminated by multiplication, so that the overall gain is in any case larger than 1, so that the oscillation condition is satisfied.

The oscillator voltage $U_{L1}$ can be coupled out already at the non-inverting output of the inverter 18, 20, 22, i.e. at the emitter of the transistor 18. Because this transistor 18 operates substantially as an emitter follower, an external low-ohmic load can already be driven without using a further driver circuit. However, when the oscillation is to be coupled out to a low-ohmic but also highly capacitive load, or when a further load which exhibits a corresponding low-ohmic impedance from an A.C. point of view is to be driven in addition, there is provided an appropriate driver circuit 23 with a further collector-connected transistor 24. The base of this transistor 24 is connected to the emitter of the transistor 18, the collector being connected to the power supply voltage and the emitter to ground via an emitter resistance 25. The emitter of this transistor 24 is connected to the terminal 15 whereto the low-ohmic and highly capacitive load to be driven is also connected. The resistance of the emitter resistance 25 is proportioned, for example, so that it is higher than the collector resistances 19, 20 and lower than the emitter resistances 21, 22. In the present example, a resistance of 4.7 kOhms was chosen. In principle, however, this resistance is suitably proportioned so that for the transistor 24 a working point is adjusted so that as a rule the dynamic emitter output resistance does not exceed that of the load.

The oscillator voltage $U_{L1}$ which can be coupled out at the emitter of the transistor 18 is fed out via the terminal 30, and the oscillator voltage $U_{L2}$ which can be coupled out at the emitter of the transistor 24 is fed out via the terminal 15.

For a permissible power supply voltage of from approximately 4.0 to 12 V it has been found that the frequency variation in dependence on the power supply voltage is comparatively small. For approximately 13 MHz, a variation of only 1 kHz per Volt occurs. The load may then be a low-ohmic type which may exhibit capacitances which are customarily obtained in the field of microprocessors, charge coupled devices etc. These have values of approximately 30 pF.

The characteristics of the invention as disclosed in the above description, in the drawing and in the claims may be of essential importance, both individually and in arbitrary combinations, for realizing the various embodiments of the invention.

I claim:

1. An oscillator comprising:
   first and second directly cross-coupled inverters,
   said first inverter comprising a first transistor connected between first and second resistances in a first series circuit coupled to terminals of a source of supply voltage for the oscillator,
   said second inverter comprising a second transistor connected between third and fourth resistances in a second series circuit coupled to said terminals of the supply voltage source,
   a frequency-determining element connected in parallel with one of the resistances in one of said inverters, and
   means for coupling an oscillator signal developed at a non-inverting output of the other one of said inverters to an output of the oscillator.

2. An oscillator as claimed in claim 1 further comprising a driver circuit having one input connected to said non-inverting output of the other one of said inverters in order to couple out a further oscillator signal.

3. An oscillator as claimed in claim 1 wherein the frequency-determining element comprises one of the following components: a quartz crystal, an LC resonant circuit.

4. An oscillator as claimed in claim 1, wherein each inverter comprises a non-inverting output coupled to one of its series connected resistances and an inverting output coupled to the other one of its series connected resistances, and for each inverter a quotient of the resistance connected to its inverting output and the resistance connected to its non-inverting output is less than one.

5. An oscillator as claimed in claim 3, wherein the frequency-determining element includes a variable tuning capacitance connected in series therewith.

6. An oscillator as claimed in claim 1, wherein an inverting output of the second transistor is directly coupled to a control electrode of the first transistor and an inverting output of the first transistor is directly coupled to a control electrode of the second transistor, said first and third resistances being connected to the inverting outputs of the first and second transistors, respectively, said second and fourth resistances being connected to non-inverting outputs of the first and second transistors, respectively, and wherein said first and third resistances have substantially equal resistance values and said second and fourth resistances also have substantially equal resistance values.

7. An oscillator as claimed in claim 1, wherein said one resistance comprises the series connected resistance connected to a non-inverting output of the first transistor.

8. An integrated circuit including an oscillator, said oscillator comprising:
   a first transistor connected between first and second resistances in a first series circuit coupled to terminals of a source of supply voltage for the oscillator,
   a second transistor connected between third and fourth resistances in a second series circuit coupled to said terminals of the supply voltage source,
   means for coupling an inverting output of the second transistor to a control electrode of the first transistor and an inverting output of the first transistor to a control electrode of the second transistor,
   means for coupling a non-inverting output of the first transistor to an output pin of the integrated circuit,
   means for coupling an external frequency-determining element to said output pin so that said frequency-determining element is connected in parallel with that one of said first and second resistances that is connected to said non-inverting output of the first transistor, and
   a further output of the integrated circuit being coupled to a non-inverting output of the second transistor for supplying an oscillation signal to an external load.

9. An integrated circuit as claimed in claim 8, further comprising an emitter follower transistor having an input coupled to said non-inverting output of the second transistor and an output coupled to another output of the integrated circuit which is adapted to supply an oscillation signal to an external low resistance, high capacitance load.

10. An integrated circuit as claimed in claim 8 wherein said first and third resistances of the oscillator are connected to the inverting outputs of the first and second transistors, respectively, and the second and fourth resistances of the oscillator are connected to the non-inverting outputs of the first and second transistors, respectively, and wherein the ratio of the resistance of said first resistance to the resistance of said second resistance is less than one and the ratio of the resistance of said third resistance to the resistance of the fourth resistance is also less than one.

11. An integrated circuit as claimed in claim 10 further comprising an external variable frequency tuning element connected in series with said frequency-determining element.

12. An integrated circuit as claimed in claim 10, further comprising an emitter follower transistor having an input coupled to said non-inverting output of the second transistor and an output coupled to another output of the integrated circuit which is adapted to supply an oscillation signal to an external load, and a fifth resistance coupled to the output of the emitter follow transistor, said fifth resistance having a resistance value intermediate the resistance values of said first and second resistances.

* * * * *